United States Patent
Bae et al.

(10) Patent No.: US 11,488,864 B2
(45) Date of Patent: Nov. 1, 2022

(54) SELF-ALIGNED SUPERVIA AND METAL DIRECT ETCHING PROCESS TO MANUFACTURE SELF-ALIGNED SUPERVIA

(71) Applicant: SAMSUNG ELECTRONICS CO., LTD., Suwon-si (KR)

(72) Inventors: Taeyong Bae, Albany, NY (US); Hoonseok Seo, Niskayuna, NY (US); Euibok Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 30 days.

(21) Appl. No.: 17/150,557

(22) Filed: Jan. 15, 2021

(65) Prior Publication Data
US 2022/0108921 A1 Apr. 7, 2022

Related U.S. Application Data

(60) Provisional application No. 63/086,867, filed on Oct. 2, 2020.

(51) Int. Cl.
| | |
|---|---|
| *H01L 21/768* | (2006.01) |
| *H01L 23/522* | (2006.01) |
| *H01L 23/528* | (2006.01) |
| *H01L 23/532* | (2006.01) |

(52) U.S. Cl.
CPC .... *H01L 21/76897* (2013.01); *H01L 21/7682* (2013.01); *H01L 21/76802* (2013.01); *H01L 21/76843* (2013.01); *H01L 21/76877* (2013.01); *H01L 23/528* (2013.01); *H01L 23/5226* (2013.01); *H01L 23/5329* (2013.01)

(58) Field of Classification Search
CPC ......... H01L 21/76897; H01L 21/76802; H01L 21/7682; H01L 21/76843; H01L 21/76877; H01L 23/5226; H01L 23/528; H01L 23/5329
See application file for complete search history.

(56) References Cited

U.S. PATENT DOCUMENTS

| | | |
|---|---|---|
| 10,283,407 B2 | 5/2019 | Chi et al. |
| 16,593,594 | 3/2020 | Lin et al. |
| 10,615,117 B2 | 4/2020 | Lin et al. |

(Continued)

OTHER PUBLICATIONS

Communication dated Feb. 24, 2022, issued by the European Patent Office in counterpart European Application No. 21193178.7.

*Primary Examiner* — Karen Kusumakar
(74) *Attorney, Agent, or Firm* — Sughrue Mion, PLLC

(57) ABSTRACT

A semiconductor device structure includes: at least one inter-metal layer stacked in a vertical direction; and a $1^{st}$ via structure penetrating the at least one inter-metal layer, wherein, in the at least one inter-metal layer, a $1^{st}$ vertical side of the $1^{st}$ via structure does not contact a barrier metal pattern while a $2^{nd}$ vertical side of the $1^{st}$ via structure opposite to the $1^{st}$ vertical side of the $1^{st}$ via structure contacts the barrier metal pattern.

16 Claims, 15 Drawing Sheets

(56) References Cited

U.S. PATENT DOCUMENTS

| | | |
|---|---|---|
| 10,672,705 B2 | 6/2020 | Xu et al. |
| 11,335,592 B2 * | 5/2022 | Chen .................. H01L 21/76802 |
| 2014/0183735 A1 * | 7/2014 | Zhang ............... H01L 21/76883 |
| | | 438/675 |
| 2015/0170965 A1 | 6/2015 | Indrakanti et al. |
| 2015/0287675 A1 | 10/2015 | Shaviv |
| 2017/0271202 A1 | 9/2017 | Xu et al. |
| 2019/0355621 A1 | 11/2019 | Marcadal et al. |
| 2022/0068703 A1 * | 3/2022 | Bao ................... H01L 21/76877 |

* cited by examiner

FIG. 14

BEOL structure including 1st to 3rd inter-metal layers, lower metal pattern 201 and etch stop layer 221 is provided, as shown in FIG. 2 (S20)

Photolithography masking is performed on 3rd inter-metal layer 230 to form 1st mask 310 which is patterned to provide space for etching 3rd inter-metal layer 230, as shown in FIG. 3 (S30)

3rd inter-metal layer 230 is etched to form 1st trench T1, as shown in FIG. 4 (S40)

1st trench T1 is filled with 2nd mask 320, and photolithography masking is performed to form 3rd mask 330 on 2nd mask 320 and pattern 3rd mask to have two openings H1/H2, as shown in FIG. 5 (S50)

Supervia etching is performed using two openings H1/H2 to form two supervia holes SH1/SH1 and two small holes R1/R2 penetrating 2nd etch stop layer 221 to expose lower metal pattern 201, as shown in FIG. 6 (S60)

2nd and 3rd masks 320 are removed to leave 2nd inter-metal layer 220 between two supervia holes SH1/SH2, as shown in FIG. 7 (S70)

2nd inter-metal layer 220 is etched to form 2nd trench T2 including supervia holes SH1/SH2, as shown in FIG. 8 (S80)

Via metal 204 is filled in 2nd trench T2 in a self-aligning manner with respect to two holes R1/R2, as shown in FIG. 9 (S90)

Using 4th mask 340 formed on two sections at top surface of via metal 204, via metal 204 is direct-etched to form 3rd trench T3 having supervias 204S1/204S2 self-aligned in two holes R1/R2, as shown in FIG. 10 (S100)

3rd trench T3 is filled with inter-metal layer 240, and 4th mask 340 is removed to finish BEOL interconnect structure including two supervias 204S1/204S2, as shown in FIG. 11 (S110)

SELF-ALIGNED SUPERVIA AND METAL DIRECT ETCHING PROCESS TO MANUFACTURE SELF-ALIGNED SUPERVIA

CROSS-REFERENCE TO THE RELATED APPLICATION

This application is based on and claims priority from U.S. Provisional Application No. 63/086,867 filed on Oct. 2, 2020 in the U.S. Patent and Trademark Office, the disclosure of which is incorporated herein in its entirety by reference.

BACKGROUND

1. Field

Apparatuses and methods consistent with example embodiments of the inventive concept relate to a via structure of a semiconductor device and, more particularly, to via structures for a via and a supervia in a back-end-of-line (BEOL) interconnect structure of the semiconductor device and a method of manufacturing the same.

2. Description of the Related Art

FIG. 1 illustrates a cross-sectional view of a related art BEOL interconnect structure of a semiconductor device.

The BEOL interconnect structure shown in FIG. 1 includes a plurality of metal structures formed in a plurality of inter-metal layers stacked in a vertical direction. These metal structures include a $1^{st}$ via 101 formed in a $1^{st}$ inter-metal layer 110, a metal pattern 102 formed in a $2^{nd}$ inter-metal layer 120 layered above the $1^{st}$ inter-metal layer 110 with an etch stop layer 115 therebetween, and a $2^{nd}$ via 103 formed above the metal pattern 102 in the $2^{nd}$ inter-metal layer 120. The metal structures also include a supervia 104 penetrating the $1^{st}$ and $2^{nd}$ inter-metal layers 110 and 120. A barrier metal pattern 105 is formed in the $1^{st}$ and $2^{nd}$ inter-metal layers to contact outer surfaces of the metal structures to facilitate adhesion of the metal structures with the $1^{st}$ and $2^{nd}$ inter-metal layers 110 and 120, respectively.

The BEOL interconnect structure of FIG. 1 is provided in a semiconductor device to connect circuit elements (not shown) formed above, in-between and/or below the $1^{st}$ and $2^{nd}$ inter-metal layers 110 and 120.

It is known that a supervia such as the supervia 104 has an advantage over a combination of a metal pattern and regular vias such as the metal pattern 102 and the $1^{st}$ and $2^{nd}$ vias 101 and 103, in terms of area gain and reduced barrier metal resistance. This is because the supervia is able to interconnect two circuit elements at one connection penetrating through one or more layers such as the inter-metal layer 110 and 120.

However, the supervia is formed in a supervia hole having a higher aspect ratio of width and depth compared to a regular via hole, and thus, it is difficult to form the supervia without concerns of misalignment with a lower metal pattern and sufficient metal-fill in the supervia hole.

Thus, there is demand of an improved supervia structure and a method of forming the same.

Information disclosed in this Background section has already been known to the inventors before achieving the embodiments of the present application or is technical information acquired in the process of achieving the embodiments described herein. Therefore, it may contain information that does not form prior art that is already known to the public.

SUMMARY

The disclosure provides semiconductor device structures having via structures for a via and a supervia having improved alignment and metal fill characteristics and a method of designing the via structures.

According to embodiments, there is provided a via structure which may include: at least one inter-metal layer stacked in a vertical direction; and a $1^{st}$ via structure penetrating the at least one inter-metal layer, wherein, in the at least one inter-metal layer, a $1^{st}$ vertical side of the $1^{st}$ via structure does not contact a barrier metal pattern while a $2^{nd}$ vertical side of the $1^{st}$ via structure opposite to the $1^{st}$ vertical side of the $1^{st}$ via structure contacts the barrier metal pattern.

According to embodiments, there is provided a method of forming a via structure. The method may include: providing a device structure comprising at least one $1^{st}$ inter-metal layer, a lower metal pattern formed below the at least one $1^{st}$ inter-metal layer; etching a section of the at least one $1^{st}$ inter-metal layer from top thereof to form a $1^{st}$ trench exposing at least a section of a top surface of the lower metal pattern; filling the $1^{st}$ trench with a via metal; etching at least one section of the via metal from top thereof to form at least one $2^{nd}$ trench exposing the top surface of the lower metal pattern so that at least one via structure comprising the via metal is formed at least one side of the at least one $2^{nd}$ trench after the etching the at least one section of the via metal; and filling the at least one $2^{nd}$ trench with a $2^{nd}$ inter-metal layer.

According to embodiments, there is provided a method of forming a via structure. The method may include: providing a BEOL interconnect structure comprising at least one $1^{st}$ inter-metal layer, a lower metal pattern formed below the at least one $1^{st}$ inter-metal layer, and an etch stop layer formed on a top surface of the lower metal pattern; etching the at least one $1^{st}$ inter-metal layer from top thereof to form a $1^{st}$ trench exposing at least one section of the top surface of the lower metal pattern; filling the $1^{st}$ trench with a via metal; etching at least one section of the via metal from top thereof to form at least one $2^{nd}$ trench exposing the etch stop layer on the top surface of the lower metal pattern so that at least one via structure comprising the via metal is formed on at least one side of the at least one $2^{nd}$ trench after the etching the at least one section of the via metal; and filling the at least one $2^{nd}$ trench with a $2^{nd}$ inter-metal layer.

The via structure such as a via or a supervia formed according to the above embodiments is characterized in that one vertical side of the via structure does not contact a barrier metal pattern while an opposite vertical side of the via structure contacts a barrier metal pattern formed in an inter-metal layer. The method of forming this via structure according to the above embodiments is characterized in that a wide-width trench having a lower width/depth aspect ratio is used to form a via metal from which the via structure is patterned, and a self-aligned via structure can be achieved by using an additional photolithography masking process as described in the following descriptions, thereby enabling easy formation of the via structure preventing insufficient metal fill and misalignment with a lower metal pattern in a BEOL interconnect structure.

BRIEF DESCRIPTION OF THE DRAWINGS

Example embodiments of the inventive concept will be more clearly understood from the following detailed description taken in conjunction with the accompanying drawings in which:

FIG. 14 illustrates a flowchart of a method of forming a via structure, according to an embodiment

DETAILED DESCRIPTION OF THE EMBODIMENTS

Figure 1:
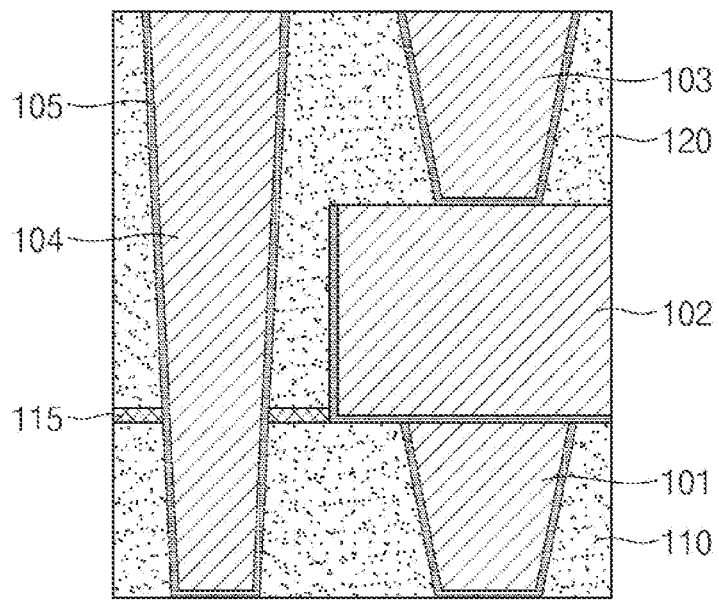
FIG. 1 illustrates a cross-sectional view of a related art semiconductor device structure.

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a MOSFET described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, even if a certain step or operation of manufacturing an inventive apparatus or structure is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements of semiconductor devices including BEOL elements may or may not be described in detail herein.

FIGS. 2 through 11 illustrate a method of manufacturing a supervia for a semiconductor device structure of a semiconductor device, according to embodiments.

Figure 2:
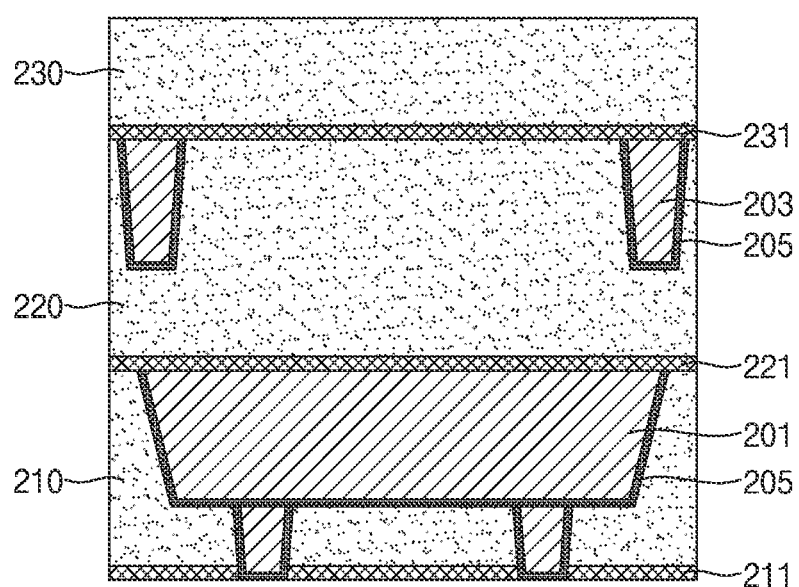
FIG. 2 illustrates a cross-sectional view of a semiconductor device structure for a semiconductor device.

Referring to FIG. 2, a BEOL interconnect structure includes $1^{st}$ to $3^{rd}$ inter-metal layers 210, 220 and 230 stacked in this order from bottom. The BEOL interconnect structure further include a lower metal pattern 201 formed in the $1^{st}$ inter-metal layer and a plurality of vias 203 formed in the $1^{st}$ and $2^{nd}$ inter-metal layers 210 and 220 to connect semiconductor circuit elements (not shown) formed above, in between and/or below the $1^{st}$ to $3^{rd}$ inter-metal layers 210, 220 and 230. A barrier metal pattern 205 is formed in the $1^{st}$ and $2^{nd}$ inter-metal layers to contact outer surfaces of the lower metal pattern 201 and the vias 203 to support adhesion of these metal structures with the $1^{st}$ and $2^{nd}$ inter-metal layers 210 and 220. The barrier metal pattern may be formed of at least one of titanium (Ti), titanium oxide (TiO) and tantalum (Ta), not being limited thereto.

Each of the $1^{st}$ to $3^{rd}$ inter-metal layers 210 to 230 may include a dielectric material such as a low-k material, and thus, may be referred to as an inter-metal dielectric (IMD) layer. The low-k material includes at least Si, C, O, H (SiCOH). However, the inventive concept is not limited thereto, and thus, different types of material may be used for the inter-metal layer.

$1^{st}$ to $3^{rd}$ etch stop layers 211, 221 and 231 are formed underneath the $1^{st}$ inter-metal layer and between the $1^{st}$ to $3^{rd}$ inter-metal layers, respectively, to stop a later etching processes performed thereat. Each of the $1^{st}$ to $3^{rd}$ etch stop layers 211, 221 and 231 may include two layers respectively formed of aluminum nitride (AlN) and oxide doped carbide (ODC), not being limited thereto, according to an embodiment. The ODC layer may be used as a hermetic barrier against moisture.

Figure 3:
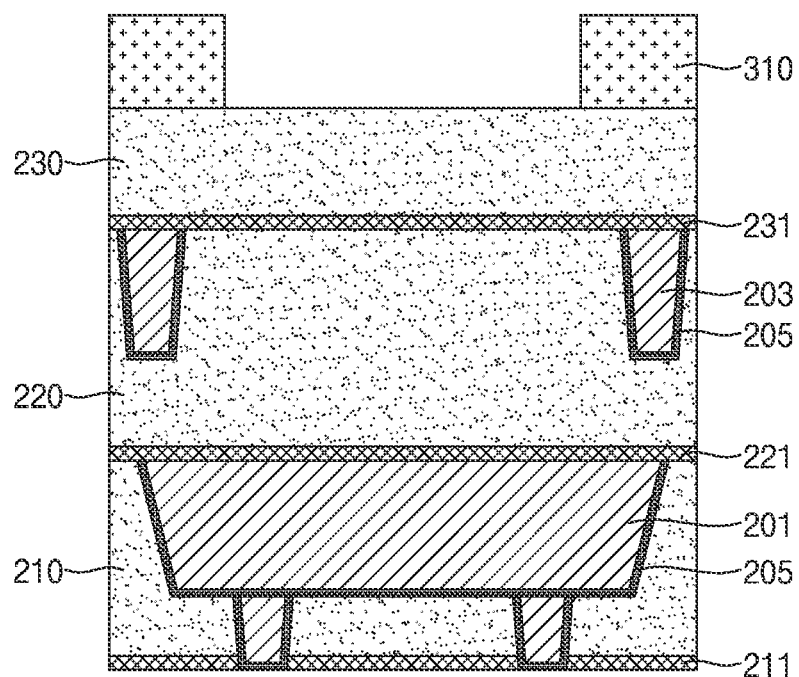
FIG. 3 illustrates a cross-sectional view of a semiconductor device structure, in which a photolithography masking process is performed on an upper inter-metal layer, according to an embodiment.

FIG. 3 shows a photolithography masking process in which a $1^{st}$ mask 310 is deposited above a top surface of the initial semiconductor device structure 200, which is a top surface of the $3^{rd}$ inter-metal layer 230, and then, a section of the $1^{st}$ mask 310 is patterned to provide a space for a follow-on etching process on the $3^{rd}$ inter-metal layer 230.

The $1^{st}$ mask 310 may be formed of, for example, a metal hard mask layer of titanium nitride (TiN) and a block cut hard mask layer of silicon oxynitride (SiON) or silicon dioxide (SiO$_2$) above the metal hard mask layer.

Figure 4:
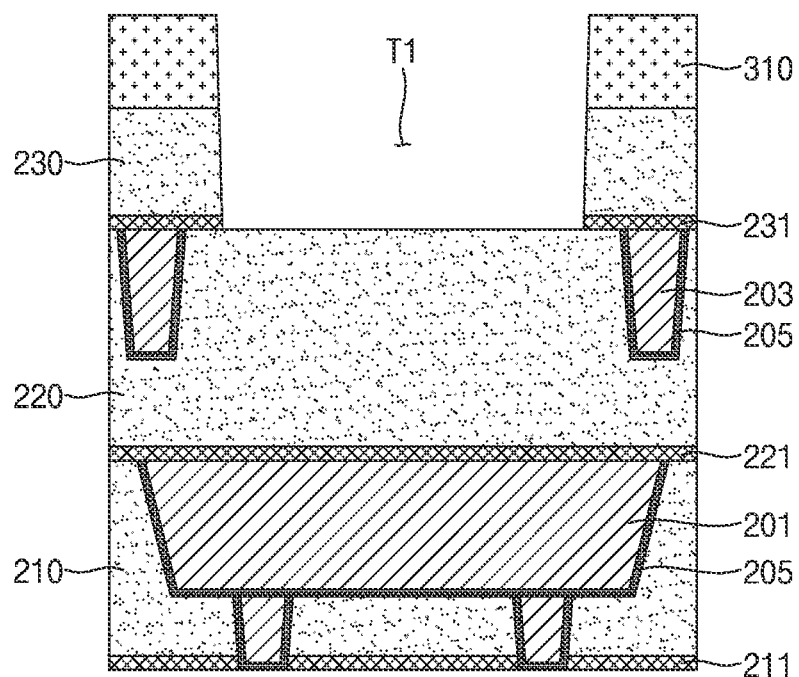
FIG. 4 illustrates a cross-sectional view of a semiconductor device structure, in which an upper inter-metal layer is etched, according to an embodiment.

Referring to FIG. 4, a section of the $3^{rd}$ inter-metal layer 230 is etched down from its top surface using the $1^{st}$ mask 310 remaining after the photolithography masking process is performed thereon as shown in FIG. 3. For this etching process, dry etching may be used for example, not being limited thereto. The dry etching on the $3^{rd}$ inter-metal layer 230 may stop at the $3^{rd}$ etch stop layer 231, and then, wet etching may be performed to remove the $3^{rd}$ etch stop layer 231 formed below the etched section of the $3^{rd}$ inter-metal layer 230, thereby to form a $1^{st}$ trench T1 exposing a section of a top surface of the $2^{nd}$ inter-metal layer 220.

Figure 5:
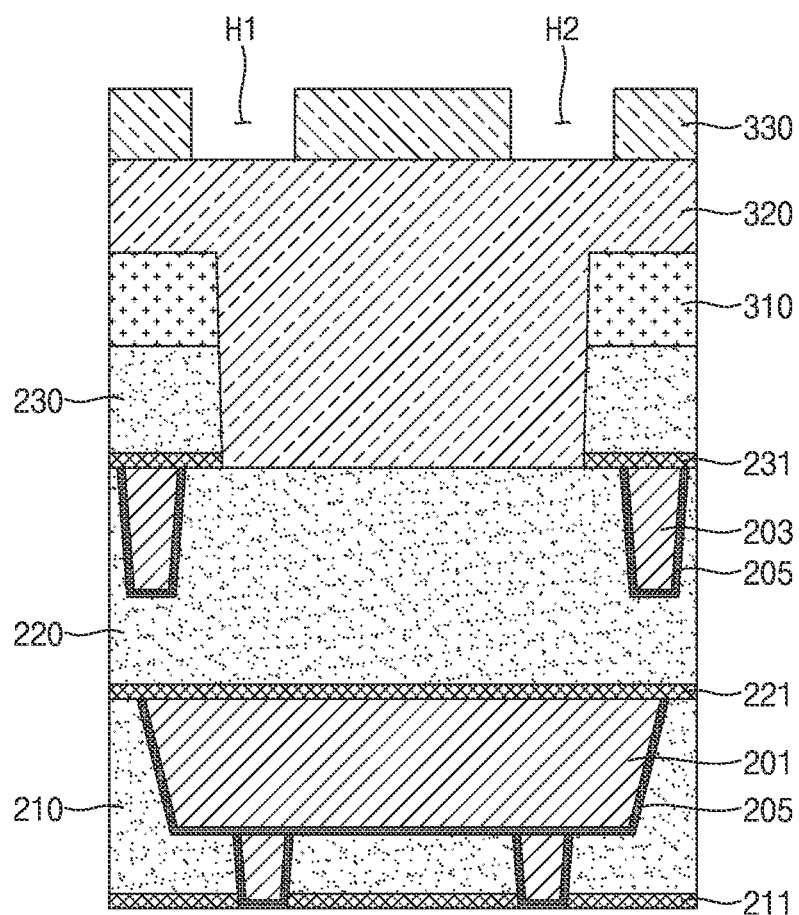
FIG. 5 illustrates a cross-sectional view of a semiconductor device structure, in which another photolithography masking process is performed, according to an embodiment.

FIG. 5 shows that the $1^{st}$ trench T1 formed in the previous step of FIG. 4 is filled with a $2^{nd}$ mask 320 that may be formed of silicon carbide (SiC), not being limited thereto. The $2^{nd}$ mask 320 is extended to and above top surfaces of the $1^{st}$ mask 310 remaining after the etching process in FIG. 3, and then planarized by, for example, chemical mechanical planarization (CMP). This $2^{nd}$ mask 320 is formed to etch at least two supervia holes as describe below. According to an embodiment, the $2^{nd}$ mask 320 is formed using a spin-on-hardmask (SOH) process.

After the planarization of the $2^{nd}$ mask 320, another photolithography masking is performed, in which a $3^{rd}$ mask 330 is layered on the $2^{nd}$ mask 320, and then, is patterned to form two openings H1 and H2 through which two sections of a top surface of the $2^{nd}$ mask 320 is exposed. Here, like the $1^{st}$ mask 310, the $3^{rd}$ mask 330 may also be formed of, for example, a metal hard mask layer of TiN and a block cut hard mask layer of SiON or SiO$_2$ above the metal hard mask layer.

Figure 6:
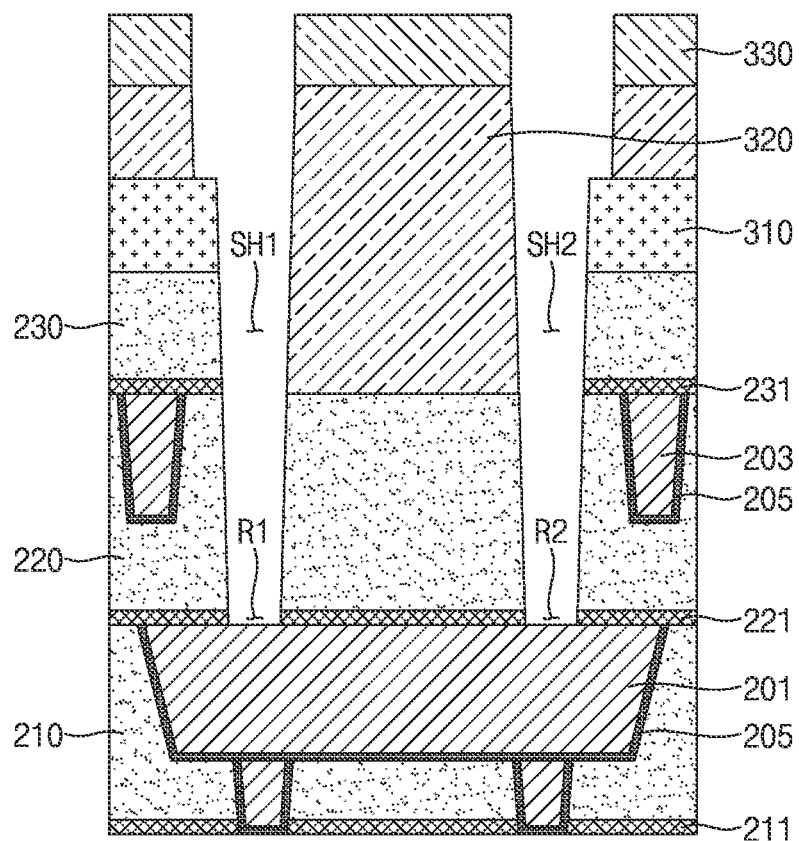
FIG. 6 illustrates a cross-sectional view of a semiconductor device structure, in which a supervia etching is performed, according to an embodiment.

Referring to FIG. 6, the $2^{nd}$ mask 320 and the $2^{nd}$ inter-metal layer 220 are etched down from the two openings H1 and H2 using the $3^{rd}$ mask 330, remaining after the photolithography masking process in FIG. 5, and the $1^{st}$ mask 310 remaining after the photolithography masking process in FIG. 3. This etching process, referred to as supervia etching, may also be performed by dry etching and/or wet etching like the previous etching process described in reference to FIG. 4. As shown in FIG. 6, this supervia etching may be performed on two sections at the $2^{nd}$ mask 320 below the two openings H1 and H2, and continue to etch corresponding two sections at the $2^{nd}$ inter-metal layer 220 and corresponding two sections at the $2^{nd}$ etch stop layer 221 until a top surface of the lower metal pattern 201 is exposed. By this supervia etching, two supervia holes SH1 and SH1 are formed to penetrate the $3^{rd}$ inter-metal layer 230, the $2^{nd}$ inter-metal layer 220 and the $2^{nd}$ etch stop layer 221 below the two openings H1 and H2. Further, this supervia etching forms two small holes R1 and R2 connected to the two supervia holes SH1 an SH2 to expose the top surface of the lower metal pattern 201 therethrough. It is understood here that the $2^{nd}$ etch stop layer 221 can be etched by wet etching.

Figure 7:
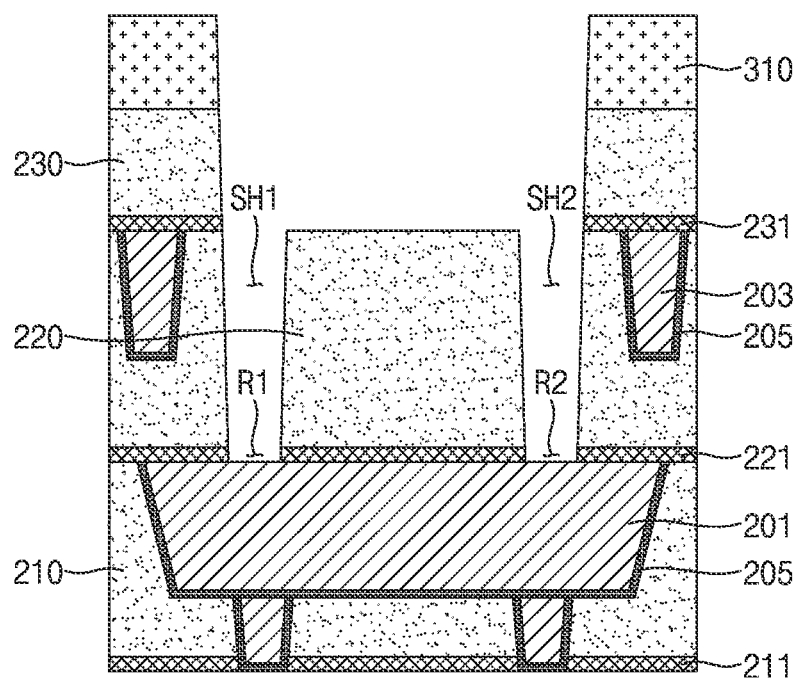
FIG. 7 illustrates a cross-sectional view of a semiconductor device structure, in which an upper inter-metal layer and an etch stop layer are etched, according to an embodiment.

FIG. 7 shows that, after forming the two supervia holes SH1 and SH2, the remaining section of the $2^{nd}$ mask 320 is removed by an ashing process such as plasma ashing, not being limited thereto, leaving the $2^{nd}$ inter-metal layer 220 between the two supervia holes SH1 and SH2 and below $2^{nd}$ mask 320 prior to its removal. For this ashing process, the $1^{st}$ mask 310 on the $3^{rd}$ inter-metal layer 230 is used for masking the $3^{rd}$ inter-metal layer 230 therebelow. The $3^{rd}$ mask 330 may also be removed in this ashing process and/or additional etching or an equivalent process.

Figure 8:
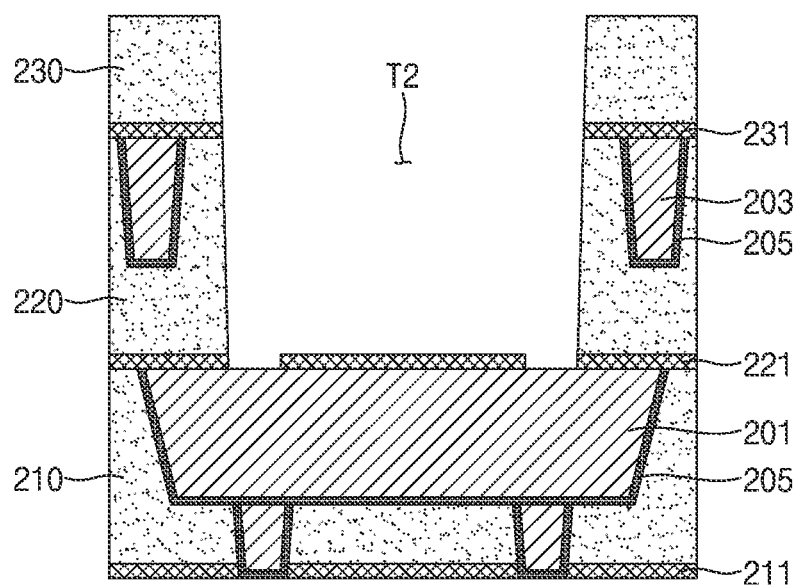
FIG. 8 illustrates a cross-sectional view of a semiconductor device structure, in which a middle inter-metal layer is etched to form a wide trench to form a via metal, according to an embodiment.

FIG. 8 shows that, using the $1^{st}$ mask 310 on the $3^{rd}$ inter-metal layer 230, the $2^{nd}$ inter-metal layer 220 between the two supervia holes SH1 and SH2 left from the ashing process in FIG. 7 is etched away, for example, by dry etching, and then, the $1^{st}$ mask 310 is stripped off. While the $2^{nd}$ inter-metal layer between the two supervia holes SH1 and SH2 is etched away, the $2^{nd}$ etch stop layer 221 formed therebelow is left to facilitate self-aligning of a via metal to form supervias in a later step, according to an embodiment. Thus, through the etching process in FIG. 8, a $2^{nd}$ trench T2 including the space corresponding to the supervia holes SH1 and SH2 at both sides is formed with its bottom surface including the $2^{nd}$ etch stop layer 221 and the top surface of the lower metal pattern 201 exposed through the two holes R1 and R2 at the etch stop layer 221 formed by the etching process in FIG. 6.

Figure 9:
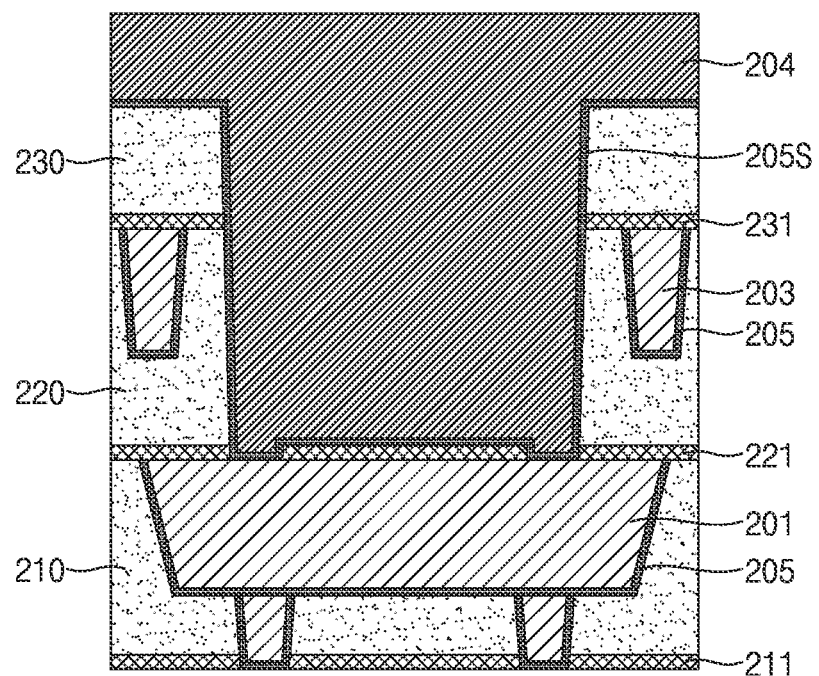
FIG. 9 illustrates a cross-sectional view of a semiconductor device structure, in which a via metal is deposited in the wide trench shown in FIG. 7, according to an embodiment.

FIG. 9 shows that a barrier metal pattern 205S is layered on the surface of the $2^{nd}$ trench T2 and extended to top surfaces of the $3^{rd}$ inter-metal layer 230 where the $1^{st}$ mask 310 is removed in the previous ashing and/or etching process of FIG. 8, and then, a via metal 204 is deposited on the barrier metal pattern 205S to fill in the $2^{nd}$ trench T2 and cover the top surfaces of the $3^{rd}$ inter-metal layer 230. Due to the apparently lower aspect ratio of width and depth of the $2^{nd}$ trench T2 than that of the related art supervia hole, the via metal 204 is easily filled in the $2^{nd}$ trench T2. Further, due to the two holes R1 and R2 at the etch stop layer 221 formed by the etching process in FIG. 6, the space corresponding to supervia hole SH1 and SH2 in the $2^{nd}$ trench T2 are filled in with the via metal 204 in a self-aligning manner. According to embodiments, the barrier metal pattern 205S and the via metal 204 may be filled in the $2^{nd}$ trench T2 by metal chemical vapor deposition (CVD), physical vapor deposition (PVD), plasma-enhanced chemical vapor deposition (PECVD), atomic layer deposition (ALD), not being limited thereto.

According to an embodiment, the via metal 204 may be formed of at least one of ruthenium (Ru) and molybdenum (Mo) for a direct etching thereon to be performed in a later step.

The via metal 204 is further formed on the top surfaces of the $3^{rd}$ layer 230 remaining after the etching process shown in FIG. 8, and planarized at the top.

Figure 10:
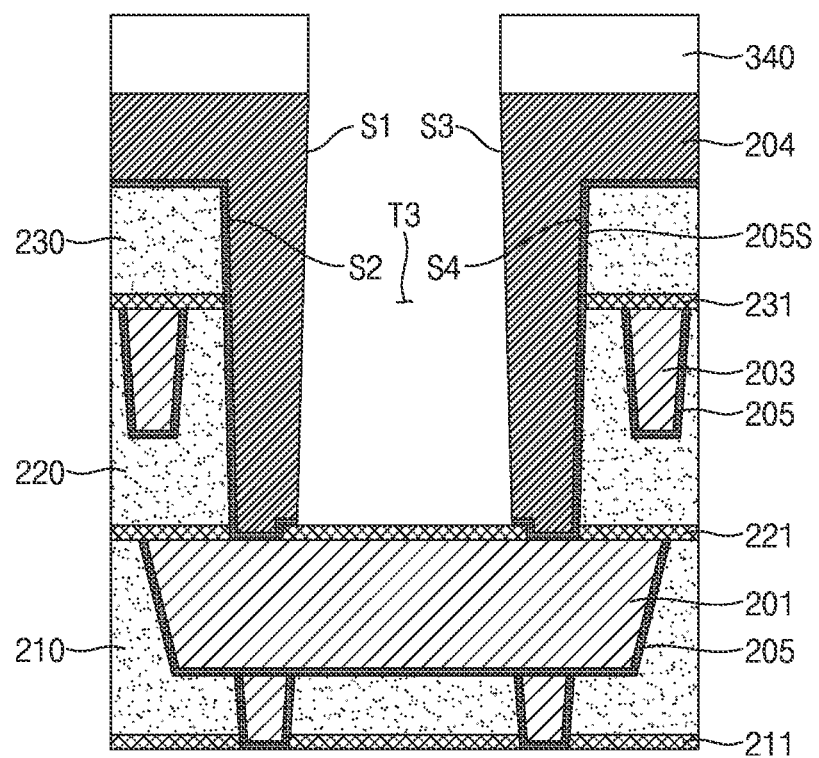
FIG. 10 illustrates a cross-sectional view of a semiconductor device structure, in which two supervia structures are formed, according to an embodiment.

In FIG. 10, a $4^{th}$ mask 340 is formed, for example, by photolithography masking, at two sections at the top surface of the via metal 204 corresponding to two sections where supervias are to be formed. And then, using the $4^{th}$ mask 340, the via metal 204 and the barrier metal pattern 205S formed therebelow above the etch stop layer 221 are direct-etched, for example, by dry etching, to form a $3^{rd}$ trench T3 with desired supervias 204S1 and 204S2, below the $4^{th}$ mask 340, self-aligned in the two holes R1 and R2, and expose the top surface of the $2^{nd}$ etch stop layer 221 layered on the lower metal pattern 201 between the two holes R1 and R2.

According to an embodiment, after the direct-etching process performed on the via metal 204 without using the convention damascene process, a vertical side S1 the supervia 204S1 and a vertical side S3 of 204S2 facing the $3^{rd}$ trench T3 do not contact any barrier metal pattern while another vertical side S2 of the supervia 204S1 and another vertical side S4 of the super via 20452 contact the barrier metal pattern 205S formed in the $2^{nd}$ trench T2.

Figure 11:
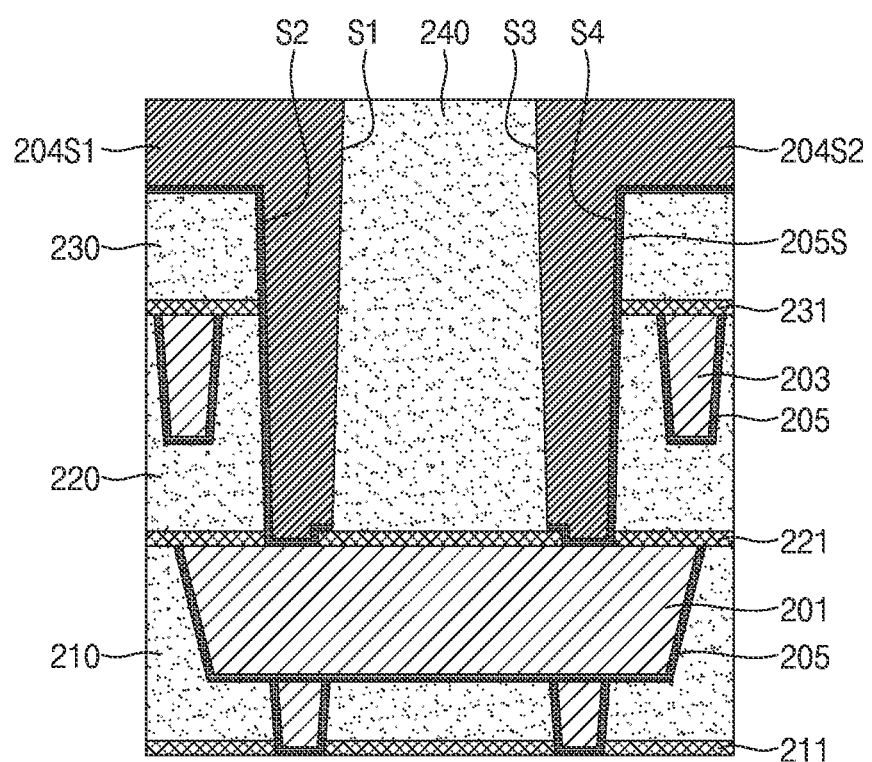
FIG. 11 illustrates a cross-sectional view of a semiconductor device structure, in which another inter-metal layer is filled between the two supervia structures shown in FIG. 10.

In FIG. 11, the $3^{rd}$ trench T3 is filled by, for example, flowable CVD (FCVD) using SiCOH to form another inter-metal layer 240, and the $4^{th}$ mask 340 is removed by, for example, dry etching, according to an embodiment.

The inter-metal layer 240 formed herein between the two supervias 20451 and 20452 may be a single layer, in which case the vertical side S1 of the supervia 20451 and the vertical side S3 of the supervia 20452 face a single inter-metal layer while the other vertical side S2 of the supervia 20451 and the other vertical side S4 of the supervia 20452 face two inter-metal layers, that is, the $2^{nd}$ and $3^{rd}$ inter-metal layers 220 and 230, through the barrier metal pattern 205S, according to an embodiment.

According to the above-described method, the supervias 20451 and 20452 having a high aspect ratio are easily formed without a concern of reaching down to the lower metal pattern 201 to which the supervias 20451 and 20452 are intended to be connected. Further, due to the additional masking and etching process including the supervia etching step shown in FIGS. 5 and 6, the supervias 20451 and 20452 are self-aligned to prevent misalignment with the lower metal pattern 201.

Referring back to FIGS. 5 and 6, the two openings H1 and H2 are patterned in the $3^{rd}$ mask 330 by a photolithography masking process and used to form the two supervia holes SH1 and SH2 where the two supervias 20451 and 20452 are formed through the following steps shown in FIGS. 7 to 11, according to an embodiment. However, the inventive concept is not limited thereto. According to embodiments, only one or more than two openings may be patterned in the $3^{rd}$ mask 330 and used to form only one or more than two supervia holes, thereby forming one supervia or more than two supervias.

Figure 12:
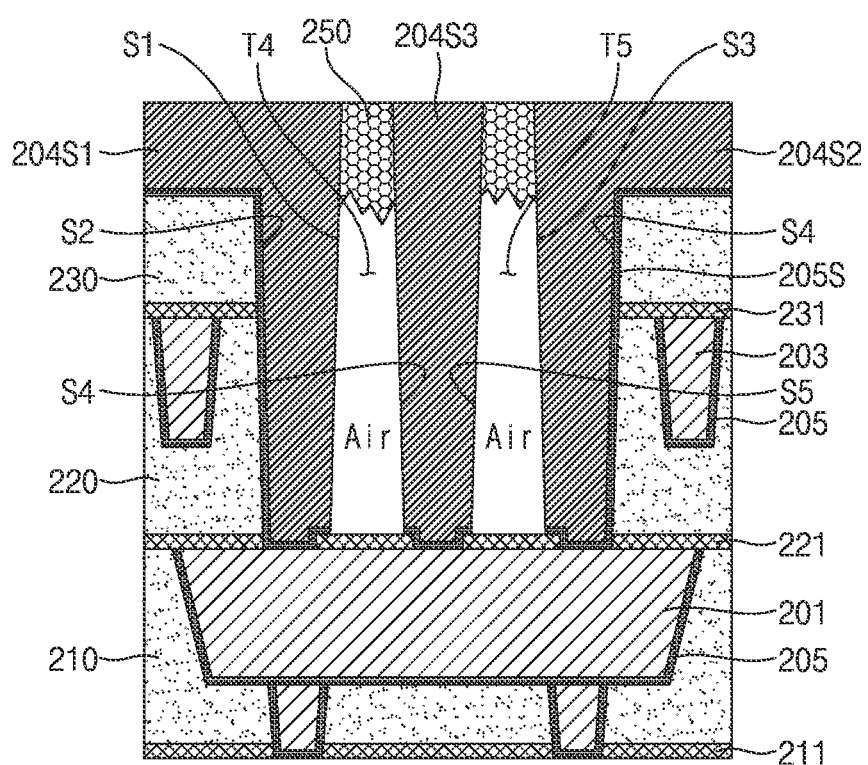
FIG. 12 illustrates a cross-sectional view of a semiconductor device structure in which three supervias are formed by a method according to an embodiment.

FIG. 12 illustrates a semiconductor device structure having three supervias, according to an embodiment.

According to an embodiment, the supervia etching step performed in reference to FIGS. 5 and 6 may be extended such that three openings instead of the two openings H1 and H2 are patterned in the $3^{rd}$ mask 330 by a photolithography masking process, and the $2^{nd}$ mask 320 and the $2^{nd}$ inter-metal layer 220 are etched using the three openings in the $3^{rd}$ mask 330 to form three supervia holes penetrating the $2^{nd}$ inter-metal layer 220 and three holes at the etch stop layer 221 opening the top surface of the lower metal pattern 201 through the three holes. After this supervia etching, the $1^{st}$ to $3^{rd}$ masks 310 to 330 may be removed by similar processes described above in reference to FIGS. 7 and 8. Next, the via metal 204 may be filled in the $2^{nd}$ trench T2 having the three holes at the etch stop layer 221 in a similar manner described above in reference to FIG. 9. Subsequently, the $4^{th}$ mask 340 may be formed on three sections above the via metal 204 to correspond to the three holes at the etch stop layer 221, and then, direct etching is applied to the via metal 204 from its top surface exposed between the three sections of the $4^{th}$ mask 340, in a similar manner described above in reference to FIG. 10.

As a result of the above process, an additional supervia 20353 in addition to the two supervias 20451 and 20452 with two trenches T4 and T5 therebetween may be obtained as shown in FIG. 12, according to an embodiment.

Meantime, as the direct etching is applied to the via metal 204 from its top surface exposed between the three sections of the $4^{th}$ mask 340 as describe above, the additional supervia 20453 obtained by the direct etching does not contact any barrier metal pattern at its two vertical sides S5 and S6 facing the two trenches T4 and T5, respectively.

After the three supervias 20451 to 20453 and the two trenches T4 and T5 are formed, an inter-metal layer 250 having low conformality such as silicon carbon nitride (SiCN) may be deposited in the two trenches T4 and T5 by plasma enhanced chemical vapor deposition (PECVD), according to an embodiment. Due to its less conformal characteristics, the inter-metal layer 250 may not fill the two trenches T4 and T5 entirely, and thus, an air gap AIR may be formed between the inter-metal layer 250 and the etch stop layer 221 at the bottom of the two trenches T4 and T5, according to an embodiment. With this air gap formed between the supervias 20451 to 20453, possible capacitance between the supervias 20451 to 20453 may be lowered than when the two trenches T4 and T5 are filled in with other low-k materials such as SiCOH.

As the inter-metal layer 250 formed in the two trenches T4 and T5 may be a single layer, in which case the two vertical sides S5 and S6 of the supervia 20453 faces a single inter-metal layer and the air gap AIR, according to an embodiment.

According to an embodiment, the above methods for forming supervias may also be applied to forming regular vias such as the vias 103 and 203 shown in FIGS. 1 to 12.

Figure 13:
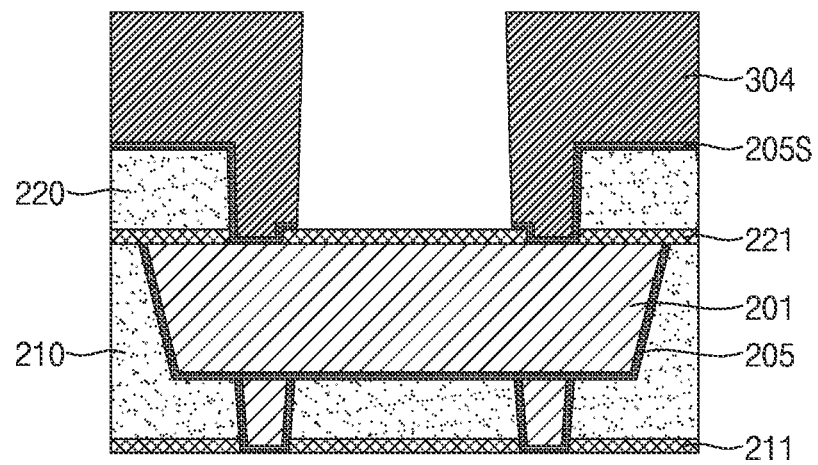
FIG. 13 illustrates a cross-sectional view of a semiconductor device structure in which a regular via is formed by a method according to an embodiment.

In the previous embodiments described in reference to FIGS. 2 to 12, the supervias 20451 to 20453 penetrating the $1^{st}$ and $2^{nd}$ inter-metal layers 210 and 220 are obtained for connection with the lower metal pattern 201. However, when the $1^{st}$ to $3^{rd}$ masks 310 to 330 used for the supervia etching in FIGS. 2 to 7 are formed on the $2^{nd}$ inter-metal layer 220, instead of the $3^{rd}$ inter-metal layer 230, to go through similar processes described in reference to FIGS. 3 to 11, a via 304, which has a regular via structure, may be obtained as shown in FIG. 13, according to an embodiment.

FIG. 14 illustrates a flowchart of a method of forming a via structure in reference to FIGS. 2-12, according to an embodiment.

In operation S20, a BEOL interconnect structure is provided on a substrate, where the BEOL interconnect structure includes $1^{st}$ to $3^{rd}$ inter-metal layers 210, 220 and 230 stacked in this order, a lower metal pattern 201 formed in the $1^{st}$ inter-metal layer, and an etch stop layer 221 formed on a top surface of the lower metal pattern 201, as shown in FIG. 2.

In operation S30, photolithography masking is performed such that a $1^{st}$ mask 310 is formed above the $3^{rd}$ inter-metal layer 230, of which a section is patterned to provide a space for etching down the $3^{rd}$ inter-metal layer 230, as shown in FIG. 3.

In operation S40, a section of the $3^{rd}$ inter-metal layer 230 is etched down using the $1^{st}$ mask 310 patterned in the previous operation to form a $1^{st}$ trench T1, of which bottom and side surfaces are defined by a top surface of the $2^{nd}$ inter-metal layer 220, the patterned $1^{st}$ mask 310 and the etched $3^{rd}$ inter-metal layer 230, as shown in FIG. 4.

In operation S50, the $1^{st}$ trench T1 is filled with a $2^{nd}$ mask 320 extended to and above top surfaces of the patterned $1^{st}$ mask 310 and then planarized, after which another photolithography masking is performed to layer a $3^{rd}$ mask 330 on the $2^{nd}$ mask 320 and pattern the $3^{rd}$ mask to have two openings H1 and H2 through which two sections of a top surface of the $2^{nd}$ mask 320 are exposed, as shown in FIG. 5.

In operation S60, supervia etching is performed on the $2^{nd}$ mask 320 and the $2^{nd}$ inter-metal layer 220 from the two openings H1 and H2 using the patterned $3^{rd}$ mask 330 and the patterned $1^{st}$ mask 310 to form two supervia holes SH1 and SH1 penetrating the $3^{rd}$ inter-metal layer 230 and the $2^{nd}$ inter-metal layer 220, and two small holes R1 and R2 connected to the two supervia holes SH1 and SH2 and penetrating the $2^{nd}$ etch stop layer 221 to expose a top surface of the lower metal pattern 201 through the two openings H1 and H2, as shown in FIG. 6.

In operation S70, the $2^{nd}$ and $3^{rd}$ masks 320 are removed by an ashing and/or etching process leaving the $2^{nd}$ inter-metal layer 220 between the two supervia holes SH1 and SH2 and below $2^{nd}$ mask 320 prior to its removal, as shown in FIG. 7.

In operation S80, using the $1^{st}$ mask 310, the $2^{nd}$ inter-metal layer 220 between the two supervia holes SH1 and SH2 and above the $2^{nd}$ etch stop layer 221 between the small holes R1 and R2 is etched away, and then, the $1^{st}$ mask 310 is stripped off, by which a $2^{nd}$ trench T2 including the supervia holes SH1 and SH2 is formed with its bottom surface defined by the $2^{nd}$ etch stop layer 221 and the top surface of the lower metal pattern 201 exposed through the two small holes R1 and R2 at the etch stop layer 221, as shown in FIG. 8.

In operation S90, a barrier metal pattern 205S is layered on the $2^{nd}$ trench T2, and then, a via metal 204 is deposited on the barrier metal pattern 205S to fill in the $2^{nd}$ trench T2. Due to the apparently lower aspect ratio of width and depth of the $2^{nd}$ trench T2 than that of the related art supervia hole, the via metal 204 is easily filled in the $2^{nd}$ trench T2. Further, due to the two holes R1 and R2 at the etch stop layer 221 formed by the etching process in FIG. 6, the supervia hole SH1 and SH2 in the $2^{nd}$ trench T2 are also filled in with the via metal 204 in a self-aligning manner, as shown in FIG. 9.

In operation S100, a $4^{th}$ mask 340 is formed on two sections at the top surface of the via metal 204, and then, using the $4^{th}$ mask 340, the via metal 204 is direct-etched to form a $3^{rd}$ trench T3 having supervias 204S1 and 20452, below the $4^{th}$ mask 340, self-aligned in the two holes R1 and R2, as shown in FIG. 10.

In operation S110, the $3^{rd}$ trench T3 is filled out with another inter-metal layer 240, and the $4^{th}$ mask 340 is removed to finish the BEOL interconnect structure including the two supervias 20451 and 20452, as shown in FIG. 11.

The above operations of forming two supervias may also apply to forming three or more supervias as shown in FIG. 12. That is, when the $3^{rd}$ mask 330 is patterned to have three openings instead of the two openings H1 and H2 in above operation S50, three supervias 204S1, 20452 and 20453 may be obtained through the subsequent operations, according to an embodiment. Similarly, when the $3^{rd}$ mask 330 is pattered to have only one opening in above operation S50, only one supervia may be obtained, according to an embodiment. Further, when the BEOL interconnect structure provided in operation S20 includes only the $1^{st}$ inter-metal layer 210, instead of the $1^{st}$ to $3^{rd}$ inter-metal layers 210, 220 and 230, for the subsequent operations, a via structure formed according to the embodiment will be a regular via, according to an embodiment.

According to the above-described embodiments, a wide trench having a lower aspect ratio of width and depth is used to form a supervia structure from which a number of desired supervias can be obtained. Further, by using an additional photolithography masking process, a self-aligned supervia can be formed. In addition, by forming an air gap between supervias, occurrence of unwanted capacitance between the supervias may be prevented. The foregoing method of forming supervias may also apply to regular via structures.

Figure 15:
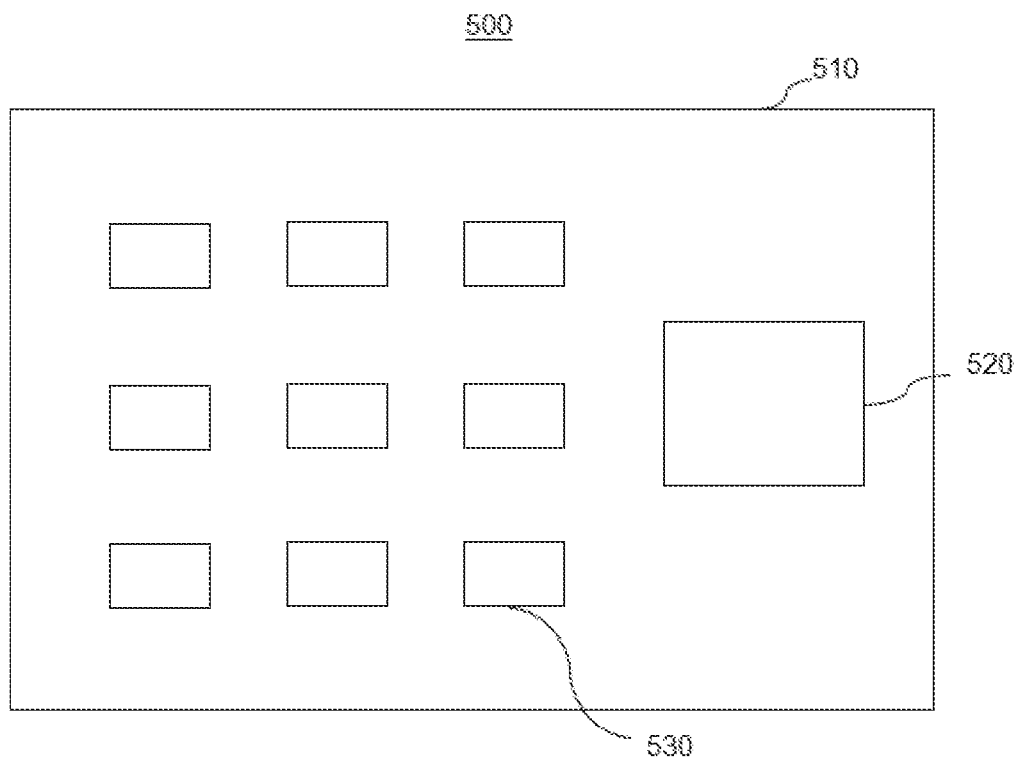
FIG. 15 illustrates a schematic plan view of a semiconductor module according to an embodiment.

FIG. 15 illustrates a schematic plan view of a semiconductor module according to an embodiment.

Referring to FIG. 15, a semiconductor module 500 according to an embodiment may include a processor 520 and semiconductor devices 530 that are mounted on a module substrate 510. The processor 520 and/or the semiconductor devices 530 may include one or more via or supervia structures described in the above embodiments.

Figure 16:
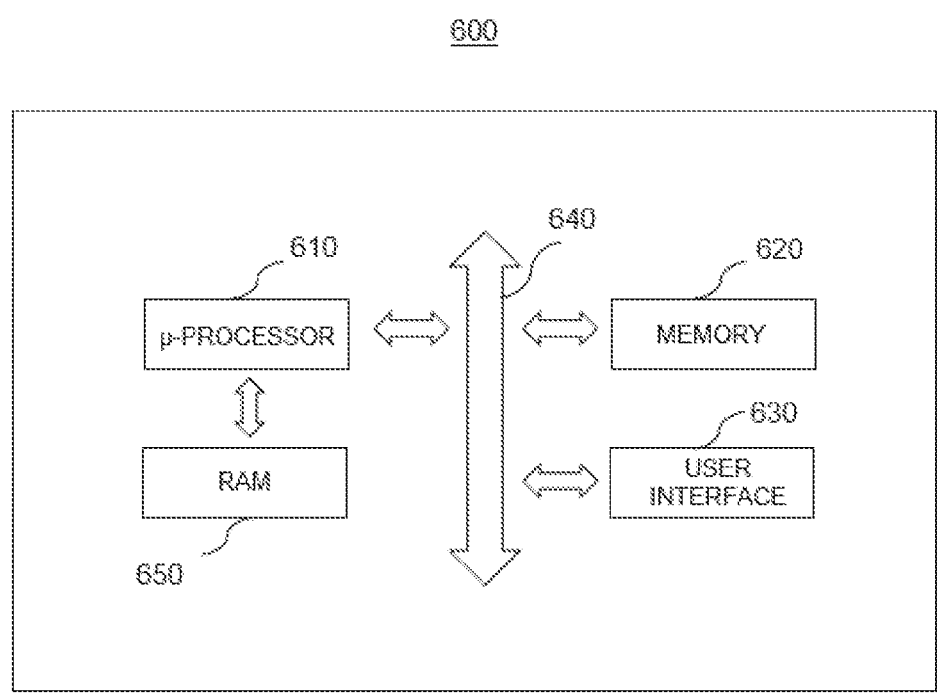
FIG. 16 illustrates a schematic block diagram of an electronic system according to an embodiment

FIG. 16 illustrates a schematic block diagram of an electronic system according to an embodiment.

Referring to FIG. 16, an electronic system 600 in accordance with an embodiment may include a microprocessor 610, a memory 620, and a user interface 630 that perform data communication using a bus 640. The microprocessor 610 may include a central processing unit (CPU) or an application processor (AP). The electronic system 600 may further include a random access memory (RAM) 550 in direct communication with the microprocessor 610. The microprocessor 610 and/or the RAM 550 may be implemented in a single module or package. The user interface 630 may be used to input data to the electronic system 600, or output data from the electronic system 600. For example, the user interface 630 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 620 may store operational codes of the microprocessor 610, data processed by the microprocessor 610, or data received from an external device. The memory 620 may include a memory controller, a hard disk, or a solid state drive (SSD).

At least the microprocessor 610, the memory 620 and/or the RAM 550 in the electronic system 600 may include one or more via or supervia structures described in the above embodiments.

The foregoing is illustrative of exemplary embodiments and is not to be construed as limiting thereof. For example, one or more steps described above for manufacturing a supervia may be omitted to simplify the process. Although a few exemplary embodiments have been described, those skilled in the art will readily appreciate that many modifications are possible in the above embodiments without materially departing from the inventive concept.

What is claimed is:

1. A via structure comprising:
   at least one inter-metal layer stacked in a vertical direction;
   a $1^{st}$ via structure penetrating the at least one inter-metal layer;
   a lower metal pattern; and
   an etch stop layer formed on a top surface of the lower metal pattern, the etch stop layer comprising a $1^{st}$ hole through which the top surface of the lower metal pattern is exposed,
   wherein, in the at least one inter-metal layer, a $1^{st}$ vertical side of the $1^{st}$ via structure does not contact a barrier metal pattern while a $2^{nd}$ vertical side of the $1^{st}$ via structure opposite to the $1^{st}$ vertical side of the $1^{st}$ via structure contacts the barrier metal pattern,
   wherein the $1^{st}$ vertical side of the $1^{st}$ via structure contacts the at least one inter-metal layer comprising only a single inter-metal layer,
   wherein the $2^{nd}$ vertical side of the $1^{st}$ via structure contacts the at least one inter-metal layer comprising at least two inter-metal layers through the barrier metal pattern,
   wherein the $1^{st}$ via structure vertically lands on the top surface of the lower metal pattern exposed through the $1^{st}$ hole, and
   wherein the single inter-metal layer is formed directly on the etch stop layer without overlapping the $1^{st}$ hole.

2. The via structure of claim 1, wherein the $1^{st}$ via structure is self-aligned in the $1^{st}$ hole formed at the etch stop layer.

3. The via structure of claim 1, further comprising a $2^{nd}$ via structure formed in parallel with the $1^{st}$ via structure in a vertical direction,
   wherein a $1^{st}$ vertical side of the $2^{nd}$ via structure does not contact the barrier metal pattern while a $2^{nd}$ vertical side of the $2^{nd}$ via structure opposite to the $1^{st}$ vertical side of the $2^{nd}$ via structure contacts the barrier metal pattern.

4. The via structure of claim 3, wherein the $1^{st}$ vertical side of the $2^{nd}$ via structure contacts the at least one inter-metal layer comprising the single inter-metal layer, and wherein the $2^{nd}$ vertical side of the $2^{nd}$ via structure contacts the at least one inter-metal layer comprising at least two other inter-metal layers through the barrier metal pattern.

5. The via structure of claim 4, wherein the etch stop layer further comprises a $2^{nd}$ hole through which the top surface of the lower metal pattern is exposed, and
   wherein the $2^{nd}$ via structure vertically land on the top surface of the lower metal pattern exposed through the $2^{nd}$ hole.

6. The via structure of claim 5, wherein the $1^{st}$ and $2^{nd}$ via structures are self-aligned in the $1^{st}$ and $2^{nd}$ holes formed at the etch stop layer, respectively.

7. A via structure comprising:
   at least one inter-metal layer stacked in a vertical direction;
   a $1^{st}$ via structure penetrating the at least one inter-metal layer;
   a $2^{nd}$ via structure formed in parallel with the $1^{st}$ via structure in a vertical direction; and
   a $3^{rd}$ via structure formed between the $1^{st}$ and $2^{nd}$ via structures in parallel with the $1^{st}$ and $2^{nd}$ via structures in the vertical direction,
   wherein, in the at least one inter-metal layer, a $1^{st}$ vertical side of the $1^{st}$ via structure and a $1^{st}$ vertical side of the $2^{nd}$ via structure do not contact a barrier metal pattern while a $2^{nd}$ vertical side of the $1^{st}$ via structure opposite to the $1^{st}$ vertical side of the $1^{st}$ via structure and a $2^{nd}$ vertical side of the $2^{nd}$ via structure opposite to the $1^{st}$ vertical side of the $2^{nd}$ via structure contact the barrier metal pattern,
   wherein an air gap is formed between the $1^{st}$ via structure and the $3^{rd}$ via structure, and between the $2^{nd}$ via structure and the $3^{rd}$ via structure, and
   wherein another inter-metal layer is formed above the air gap between the $1^{st}$ via structure and the $3^{rd}$ via structure and between the $2^{nd}$ via structure and the $3^{rd}$ via structure.

8. The via structure of claim 7, further comprising a lower metal pattern and an etch stop layer formed on a top surface of the lower metal pattern, the etch stop layer comprising three holes through which the top surface of the lower metal pattern is exposed,
   wherein the $1^{st}$ to $3^{rd}$ via structures vertically land on the top surface of the lower metal pattern exposed through the three holes.

9. A method of forming a via structure, the method comprising:
   providing a device structure comprising at least one $1^{st}$ inter-metal layer, a lower metal pattern formed below the at least one $1^{st}$ inter-metal layer;
   etching a section of the at least one $1^{st}$ inter-metal layer from top thereof to form a $1^{st}$ trench exposing at least a section of a top surface of the lower metal pattern;
   filling the $1^{st}$ trench with a via metal;
   etching at least one section of the via metal from top thereof to form at least one $2^{nd}$ trench exposing the top surface of the lower metal pattern so that at least one via structure comprising the via metal is formed at least one side of the at least one $2^{nd}$ trench after the etching the at least one section of the via metal; and
   filling the at least one $2^{nd}$ trench with a $2^{nd}$ inter-metal layer.

10. The method of claim 9, wherein the etching at least one section of the via metal comprises etching at least one middle section of the via metal from top thereof to form the at least one $2^{nd}$ trench exposing the top surface of the lower metal pattern so that at least two via structures comprising the via metal are formed on at least two sides of the at least one $2^{nd}$ trench after the etching the at least one middle section of the via metal.

11. The method of claim 9, wherein the filling the $1^{st}$ trench with a via metal comprises:
    layering a barrier metal pattern on a surface of the $1^{st}$ trench; and
    filling the via metal in the $1^{st}$ trench on which the barrier metal pattern is layered.

12. A method of forming a via structure in a back-end-of-line (BEOL) interconnect structure, the method comprising:
    providing a device structure comprising at least one $1^{st}$ inter-metal layer, a lower metal pattern formed below the at least one $1^{st}$ inter-metal layer, and an etch stop layer formed on a top surface of the lower metal pattern;
    etching the at least one $1^{st}$ inter-metal layer from top thereof to form a $1^{st}$ trench exposing at least one section of the top surface of the lower metal pattern;
    filling the $1^{st}$ trench with a via metal;
    etching at least one section of the via metal from top thereof to form at least one $2^{nd}$ trench exposing the etch stop layer on the top surface of the lower metal pattern so that at least one via structure comprising the via metal is formed on at least one side of the at least one $2^{nd}$ trench after the etching the at least one section of the via metal; and
    filling the at least one $2^{nd}$ trench with a $2^{nd}$ inter-metal layer.

13. The method of claim 12, wherein the etching the at least one $1^{st}$ inter-metal layer comprises:
    forming at least one mask on the at least one $1^{st}$ inter-metal layer, and patterning the at least one mask to form at least one opening therein, through photolithography masking;
    etching the at least one $1^{st}$ inter-metal layer and the etch stop layer through the at least one opening to form at least one via hole including at least one hole at the etch stop layer exposing the top surface of the lower metal pattern;
    removing the at least one mask; and
    etching the at least one $1^{st}$ inter-metal layer at a side of the at least one via hole to form the $1^{st}$ trench, of which a bottom comprises the at least one section of the top surface of the lower metal pattern and the etch stop layer.

14. The method of claim 13, wherein the filling the $1^{st}$ trench with a via metal comprises self-aligning the via metal in the at least one hole formed at the etch stop layer.

15. The method of claim 14, wherein the etching at least one section of the via metal comprises etching at least one middle section of the via metal from top thereof to form the at least one $2^{nd}$ trench exposing the at least one section of the top surface of the lower metal pattern so that at least two via structures comprising the via metal are formed on at least two sides of the at least one $2^{nd}$ trench after the etching the at least one middle section of the via metal.

16. The method of claim 12, wherein the filling the $1^{st}$ trench with the via metal comprises:
    layering a barrier metal pattern on a surface of the $1^{st}$ trench; and
    filling the via metal in the $1^{st}$ trench on which the barrier metal pattern is layered.

* * * * *